United States Patent [19]
Castagnetti et al.

[11] Patent Number: 6,162,714
[45] Date of Patent: Dec. 19, 2000

[54] METHOD OF FORMING THIN POLYGATES FOR SUB QUARTER MICRON CMOS PROCESS

[75] Inventors: Ruggero Castagnetti, San Jose; Yauh-Ching Liu, Sunnyvale; Gary Giust; Subramanian Ramesh, both of Cupertino, all of Calif.

[73] Assignee: LSI Logic Corporation, Milpitas, Calif.

[21] Appl. No.: 08/991,397

[22] Filed: Dec. 16, 1997

[51] Int. Cl.$^7$ ................................ H01L 21/8238
[52] U.S. Cl. ............................ 438/587; 438/199
[58] Field of Search ................... 438/365–369, 438/370–373, 424, 199, 307, 585, 587, 257

[56] References Cited

U.S. PATENT DOCUMENTS

| | | | |
|---|---|---|---|
| 5,700,719 | 12/1997 | Yuzurihara et al. | 438/199 |
| 5,723,357 | 3/1998 | Huang | 438/424 |
| 5,770,493 | 6/1998 | Fulford, Jr. | 438/199 |
| 5,786,255 | 7/1998 | Yeh et al. | 438/305 |
| 5,827,761 | 10/1998 | Fulford, Jr. et al. | 438/199 |
| 5,911,111 | 6/1999 | Bohr et al. | 438/585 |
| 6,033,944 | 3/2000 | Shida | 438/199 |

OTHER PUBLICATIONS

S. Wolf, Silicon Processing For The VLSI Era. Lattice Press, vol. 2, p. 203, 1990.

C. Chang, H. Lin, Tan Lei, J. Cheng, L. Chen, B. Dai, "Fabrication of Thin Film Transistors by Chemical Mechanical Polished Polycrystalline Silicon Films," *IEEE Electron Device Letters*, vol. 17, No. 3, Mar. 1996, pp. 100–102.

*Primary Examiner*—Olik Chaudhuri
*Assistant Examiner*—Anh Duy Mai

[57] ABSTRACT

A method is provided for forming thin polysilicon transistor gates using dual doped polysilicon without reducing the ion implant energy. The method comprises depositing polysilicon over a region of a substrate, masking and implanting the polysilicon with dopant impurities to form the channel regions of one conductivity type, and removing the photo resist mask. The polysilicon layer is then masked to define the channel regions of the opposite conductivity type and is implanted with dopant impurities of the opposite conductivity type. Following the dual ion implantation, the photo resist mask is removed and the substrate may be annealed to activate the dopants in the polysilicon. The dual doped polysilicon layer is then polished using a chemical-mechanical polish to achieve a desired thickness for the polysilicon transistor gates. The polysilicon is subsequently masked and etched to define the polysilicon transistor gates.

8 Claims, 5 Drawing Sheets

METHOD OF FORMING THIN POLYGATES FOR SUB QUARTER MICRON CMOS PROCESS

FIELD OF THE INVENTION

This invention relates generally to the processing of semiconductors and integrated circuits, and more particularly, to a method of forming thin polysilicon gates for semiconductor devices.

BACKGROUND OF THE INVENTION

As semiconductor devices are scaled down to dimensions smaller than 0.25 µm, it is necessary to reduce the polysilicon gate thickness in order to maintain a vertical aspect ratio around one and to reduce the minimum spacing between polysilicon features. However, reducing the thickness of the polysilicon for forming transistor gates for sub 0.25 µm CMOS processes has proven to be extremely difficult.

Conventional CMOS processes for technologies down to 0.25 µm typically deposit 2000 Å of polysilicon followed by an ion implantation and an anneal. The polysilicon is then patterned and etched to form the transistor gates. However, reducing the polysilicon thickness for sub 0.25 µm technologies requires a reduction of the ion implant energy in order to prevent the penetration of dopants into the channel region. In addition, when implanting a thin polysilicon layer with a high dose of dopants, outdiffusion of the same dopants may occur during the subsequent anneal step. An alternative solution to reducing the polysilicon gate thickness may be the use of insitu-doped polysilicon. However, the complexity of such processing renders it extremely difficult to implement.

Thus, there is a need for a simple method for reducing the thickness of the polysilicon transistor gates for sub 0.25 micron processes which does not require a reduction in the ion implant energy, which does not cause outdiffusion, and which facilitates dual doping of the polysilicon to form the transistor gates.

SUMMARY OF THE INVENTION

In accordance with the method of the present invention, the thickness of the polysilicon transistor gates is reduced without the need for reducing the ion implantation energy. The present invention also provides a simple method for forming thin polysilicon transistor gates which incorporate dual doped polysilicon.

After several conventional CMOS processing steps, a layer of polysilicon is deposited over a region of the substrate. The thickness of the polysilicon is selected according to the needs of a subsequent ion implantation and anneal. The region is then masked to provide protected and unprotected regions. After masking, the region is implanted with ions to dope the polysilicon. The doped polysilicon is then annealed to activate the ions within the polysilicon. After implantation and anneal, the polysilicon layer is polished, such as by chemical-mechanical polishing (CMP), to obtain the desired final polysilicon thickness. Finally, the polysilicon is patterned and etched to form the polysilicon transistor gates.

The polishing of the polysilicon layer after implantation and anneal allows the polysilicon to go through a dual doping process without the need to reduce the ion implantation energies and without concern about outdiffusion of the dopants during the anneal. Thus, the final polysilicon thickness may be configured to the minimum feature size of the gate while maintaining simple implantation and anneal processing steps.

DESCRIPTION OF THE PREFERRED EMBODIMENT

Figure 1A:
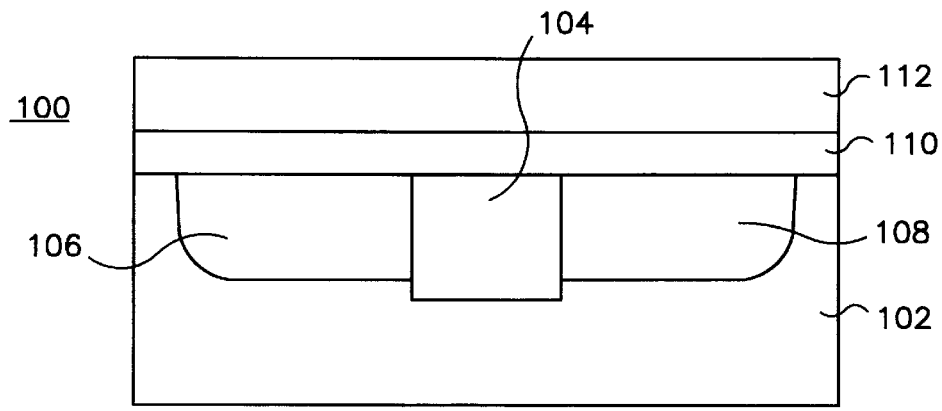
FIGS. 1A–1H are cross-sectional views of a semiconductor substrate in various stages of processing in accordance with the present invention.

Referring to FIG. 1A there is shown a cross-sectional view of a semiconductor wafer 100 comprising a substrate 102, a trench 104, a p-well region 106, an n-well region 108 and a gate dielectric layer 110 in accordance with the present invention. According to one embodiment of the present invention, a predoped semiconductor substrate 102 of a desired semiconductor material such as silicon, for example, is selected for processing. Typically, the selected semiconductor material will be a silicon wafer cut from a single silicon crystal. Next, a trench 104 is formed in the substrate to isolate the active regions. One method for forming the trench 104 is the use of a shallow trench isolation (STI) scheme. With this scheme, the trench 104 is formed using conventional photolithographic processing and a dry etch step. The trench 104 is then filled with oxide, preferably a TEOS oxide with a low temperature deposition step. The deposited oxide is then densified by a high temperature step at approximately 1000 degrees Centigrade. After formation and densification of the deposited oxide layer, the substrate 102 is planarized or polished, preferably using a chemical-mechanical polish (CMP) to remove excessive portions of the oxide layer.

After formation of the shallow trench isolation, a p-well region and a n-well region are fabricated in the semiconductor substrate 102. If the substrate 102 is suitably predoped with p-material, no separate establishment of a p-well is required. As applicable, the p-well region 106 and n-well region 108 are fabricated using conventional photolithographic processing techniques and equipment. The p-well region 106 is formed by implanting the substrate 102 with a p-type dopant impurity such as Boron with an energy of 200 keV and a dose of about 1E13 atoms $cm^{-2}$. Preferably, the n-well region 108 is formed by implanting phosphorus at 500 keV with a dose of about 1E13 atoms $cm^{-2}$. The energy and dose for forming the p-well region 106 and the n-well region 108 may vary depending on the complexity of the well architecture. After the p-well and n-well dopants are implanted, the substrate 102 is heated to activate the dopant impurities in the silicon crystalline structure of the substrate 102 to form the p-well region 106 and the n-well region 108.

After forming the p and n wells, a gate dielectric layer is formed on substrate 102. Preferably, the gate dielectric layer 110 is a layer of oxide grown in conventional manner in dry or wet oxygen ambiance reactors with a thickness from about 20 Å to about 100 Å.

After the gate dielectric layer 110 has been formed over the substrate 102, the semiconductor wafer 100 is deposited with polysilicon 112. The thickness of the polysilicon layer 112 is selected according to the subsequent ion implantation and anneal of the polysilicon layer 112. In a preferred embodiment of the invention, the thickness of the polysilicon layer 112 is between about 2000 Å and 3000 Å. Typically, the polysilicon layer 112 may be formed in conventional manner by low pressure chemical vapor deposition (LPCVD). For example, the reaction of silane with hydrogen at approximately 575° C. to 650° C. and a pressure of between 0.1 and 1 Torr produces suitable polysilicon films for depositing the polysilicon layer 112.

Figure 1B:
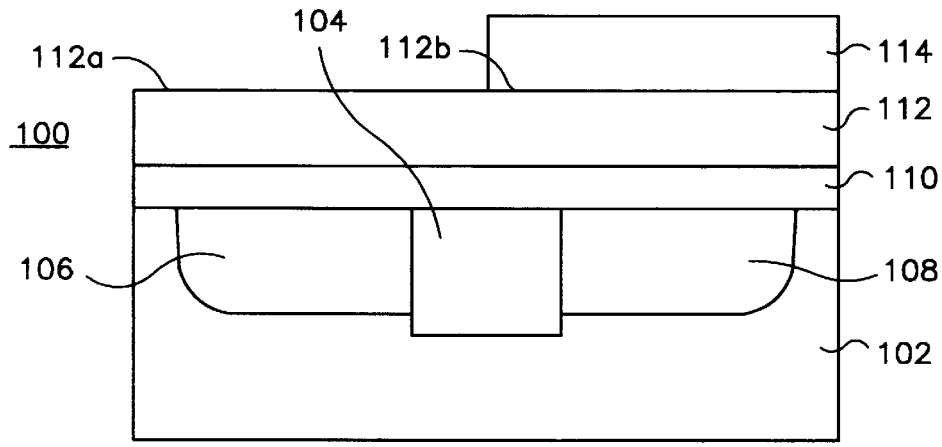

Once the polysilicon layer 112 has been formed over the gate dielectric layer 110, the semiconductor wafer 100 is masked for ion implantation in conventional manner of one dopant impurity. Referring now to FIG. 1B, there is shown a cross-sectional view of a semiconductor wafer 100 following deposition of a photo-resist mask 114. For clarity, the polysilicon layer 112 of the semiconductor wafer 100 has been designated as exposed polysilicon layer 112a and masked polysilicon layer 112b. The photo resist 114 is deposited as a thin film of polymer material that is processed in conventional manner. The thickness of the photo-resist 114 is selected to mask the underlying areas of the semiconductor wafer 100 against ion implantation. Typical thickness for the photo-resist mask 114 is between 0.5 $\mu$m and 1 Åm.

Figure 1C:
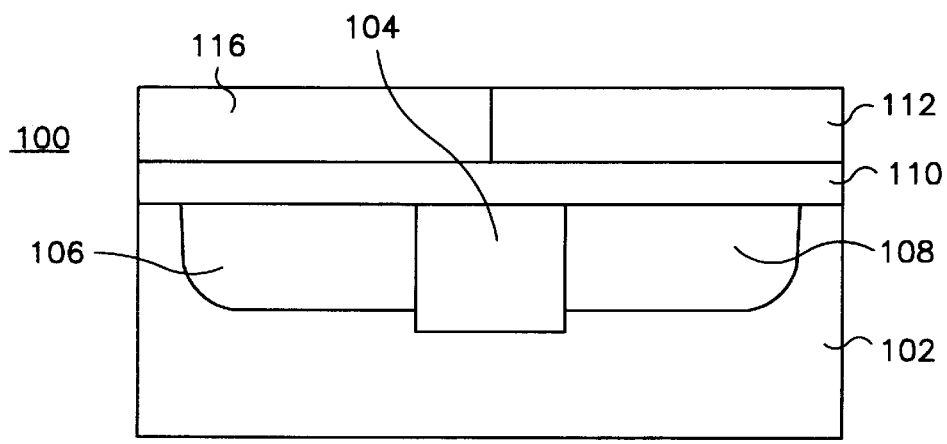

Referring now to FIG. 1C, there is shown a cross-sectional view of a semiconductor wafer 100 following ion implantation to form regions of doped polysilicon 110 and following removal of the photo resist 114. In a preferred embodiment of the present invention, the doped polysilicon 116 is an n-doped polysilicon formed by ion implantation of either phosphorus or arsenic. In the disclosed embodiment, the ions are implanted at energies ranging from about 20 to 80 keV and with a dose ranging from about 5E14 to 5E15 atoms cm$^{-2}$. It is understood that the cross-sectional views of FIGS. 1A through 1H represent only one region of a semiconductor wafer 100, and that multiple doped polysilicon regions 116 can be formed on a semiconductor wafer 100 simultaneously.

Figure 1D:
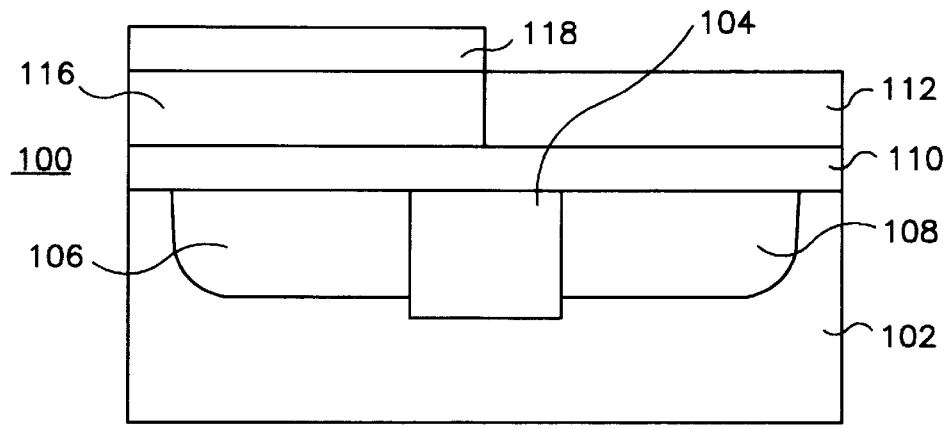

After formation of the doped polysilicon regions 116, the undoped regions of the polysilicon layer 112 may be implanted in conventional manner with an opposite dopant impurity. In a preferred embodiment of the present invention, the polysilicon layer 112 is doped with an opposite dopant impurity. A dual-doped polysilicon is required to obtain symmetric threshold voltages for the n- and p-channel transistors. Referring now to FIG. 1D, there is shown a semiconductor wafer 100 following deposition of a photo-resist mask 118. The photo-resist 118 masks the underlying layers of the doped polysilicon regions 116. The photo resist 118 is deposited as a thin film of polymer material that is processed in conventional manner. The thickness of the photo-resist 118 is selected to mask the underlying areas of the semiconductor wafer 100 against ion implantation. Typical thickness for the photo-resist mask 118 is between about 0.5 and 1.0 $\mu$m.

Figure 1E:
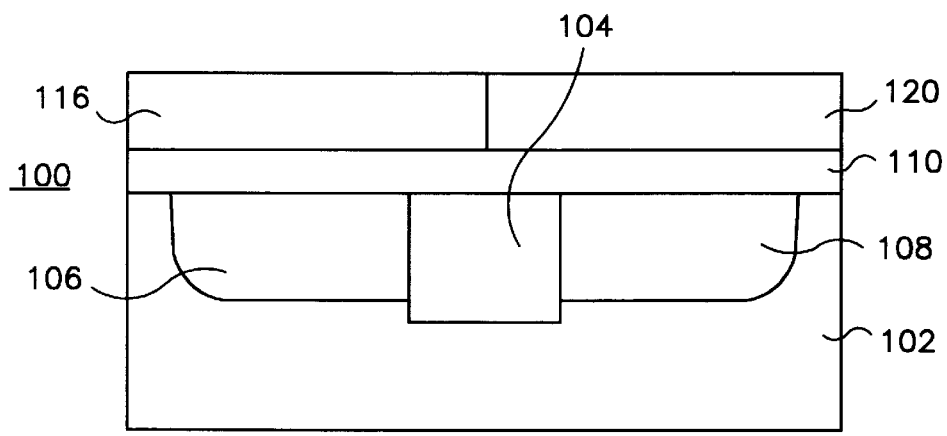

Referring now to FIG. 1E, there is shown a cross-sectional view of a semiconductor wafer 100 following ion implantation to form a second doped polysilicon region 120. In a preferred embodiment of the present invention, the second doped polysilicon region 120 is a p-doped region formed by ion implantation of Boron in conventional manner. In the disclosed embodiment, the ions are deposited at energies between the range of 10 and 60 keV and with a dose of about 5E14 to 5E15 cm$^{-2}$. It is understood that the cross-sectional views of FIGS. 1A through 1H represent only one region of a semiconductor wafer 100, and that multiple second doped polysilicon regions 120 can be formed on a semiconductor 100, simultaneously.

In a preferred embodiment of the present invention, after the ion implantation steps, the semiconductor wafer 100 is annealed in conventional manner to activate the dopants and to form a polysilicon with a low resistivity. Preferably, either a furnace anneal at a temperature ranging from about 750 C. to 900 C. for several minutes or a rapid thermal anneal (RTA) at a temperature of about 900 C. to 1100 C. for a few seconds can be used to anneal the semiconductor wafer 100.

After the polysilicon layer 112, comprising the first doped polysilicon regions 116 and the opposite doped polysilicon regions 120, has been implanted and annealed, the semiconductor wafer 100 is polished to reduce the polysilicon layer 112 to a final desired target thickness. Polishing of the polysilicon layer 112 may be either a mechanical, chemical or chemical-mechanical polish (CMP) in conventional manner. In a preferred embodiment of the invention, the final target thickness of the polysilicon layer 112 is between about 500 Å and about 1500 Å. In a preferred embodiment of the present invention, the polishing of polysilicon layer 112 includes chemical-mechanical polishing (CMP) in conventional manner. Conventional in-situ measurement tools may be used to monitor the thickness of the polysilicon layer during the polishing process in order to obtain the desired thickness of the polysilicon layer.

Polishing of the polysilicon layer 112 provides a desired final polysilicon thickness while at the same time facilitates simple implant and anneal steps. Additionally, polishing the polysilicon layer 112 in order to reduce the polygate thickness, typically to about 500 Å to 1500 Å for sub 0.25 micron processes, allows reduction of the minimum spacing between polysilicon features and maintenance of a vertical aspect ratio of around one. Moreover, polishing of the polysilicon layer 112 provides a flat surface for a more uniform resist thickness for the subsequent masking and etching of the polysilicon layer 112 in order to form the transistor polygates. This also creates more uniform polysilicon dimensions as steps in the underlying topology are traversed.

Figure 1F:
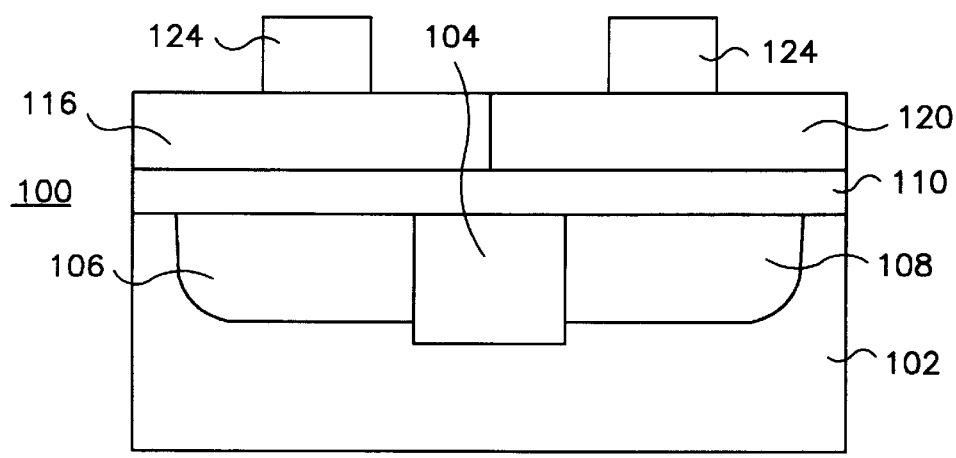

Once the polysilicon layer 112 has been polished to the desired final target thickness, the semiconductor wafer 100 is masked for etching of a set of polysilicon transistor gates. Referring now to FIG. 1F, there is shown a cross-sectional view of a semiconductor wafer 100 following deposition of a photo-resist mask 124 that is deposited as a thin film of polymer material which is processed in conventional manner. The thickness of photo-resist 124 is selected to ensure that some photo-resist 124 remains after completion of the polysilicon etch process that also erodes the photo resist 124. Typical thickness for the photo-resist mask 124 is between about 0.5 $\mu$m and 1.0 $\mu$m.

Figure 1G:
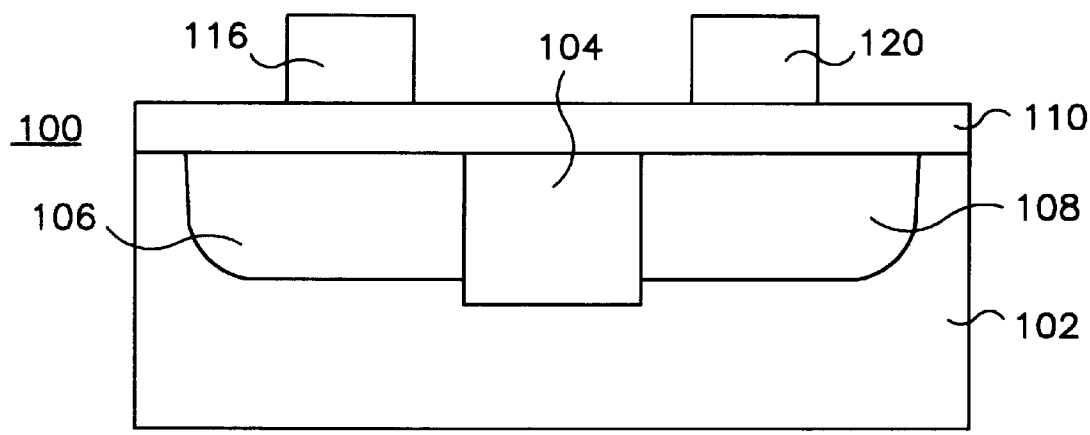

Following the developing of the photo-resist layer 124, the exposed polysilicon layer 112e is etched. Referring now to FIG. 1G, there is shown a cross-sectional view of a semiconductor wafer 100 and the photo-resist 124 following an etch step to remove the exposed portion of the polysilicon layer 112. Preferably, the polysilicon layer 112 is dry etched in conventional manner with chlorine based etch gases and hydrogen bromide. Following this etch step, the photo-resist layer 124 is removed in conventional manner.

After the polysilicon gates have been fabricated, the source and drain regions are formed. A photo-resist layer is deposited as a thin film of polymer material that is processed in conventional manner and is used to protect silicon areas from getting the wrong implant. Preferably, the thickness for the photo-resist mask is between about 0.5 and 1 $\mu$m. In a preferred embodiment of the present invention, first source and diffusion regions 128 are a n-doped region formed by ion implantation of arsenic in conventional manner. After implantation, the photo resist layer is removed in conventional manner.

Figure 1H:
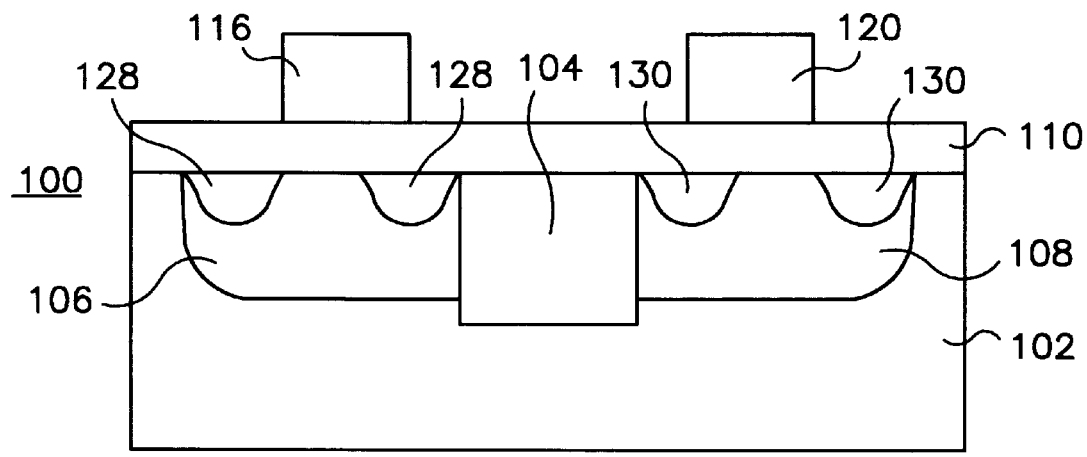

The semiconductor wafer 100 is then implanted a second time with an opposite dopant impurity in order to form a second set of source and drain diffusion regions 130 for the second doped polysilicon regions 120. In a preferred embodiment of the present invention, the semiconductor wafer 100 is implanted in conventional manner with boron dopant impurities after deposition and development of a photo resist layer in conventional manner. Afterwards, the photo resist mask is removed in conventional manner. Referring now to FIG. 1H, there is shown a cross-sectional view of a semiconductor wafer 100 following both ion implantations to form the first and second set of source and drain diffusion regions 128, 130. Preferably, semiconductor wafer 100 is annealed using an RTA process at approximately 1000 degrees Centigrade in conventional manner after the second implant. Finally, standard MOS processes are used to complete processing of the semiconductor wafer 100.

Figure 2A:
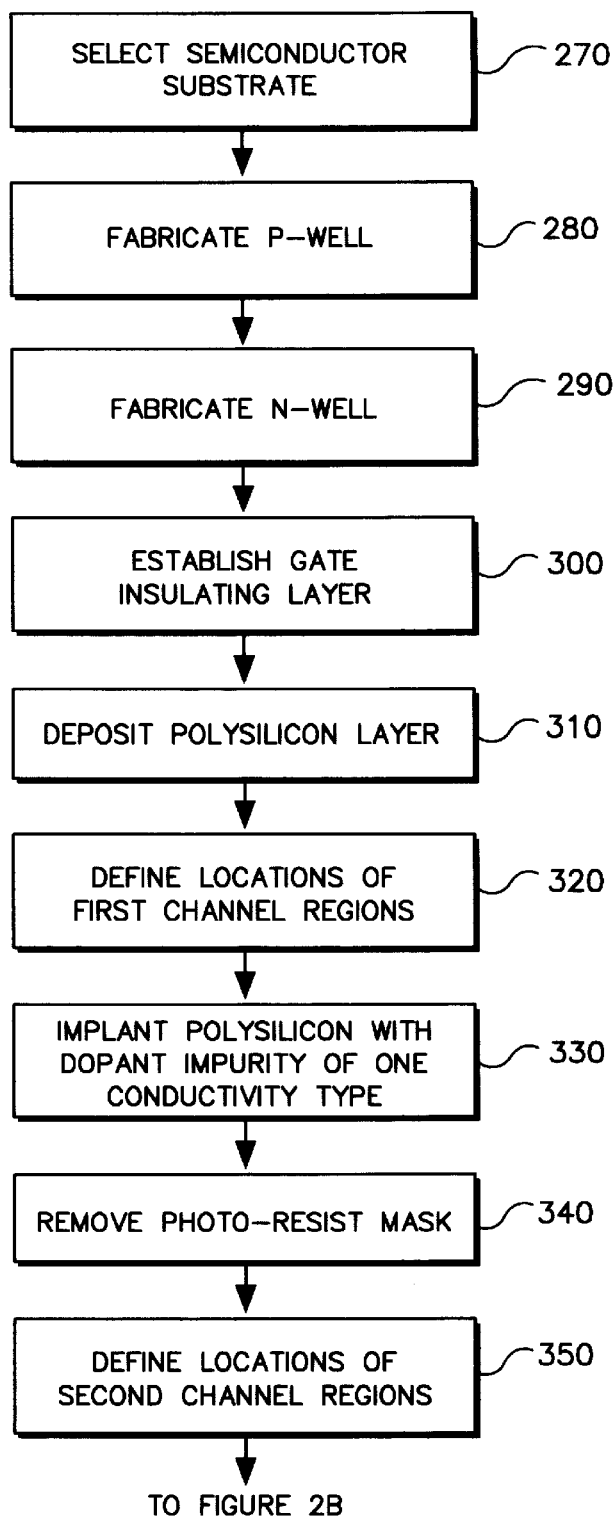
FIGS. 2A and 2B comprise a flow chart representing the stages of the process shown in FIGS. 1A–1H.
Figure 2B:
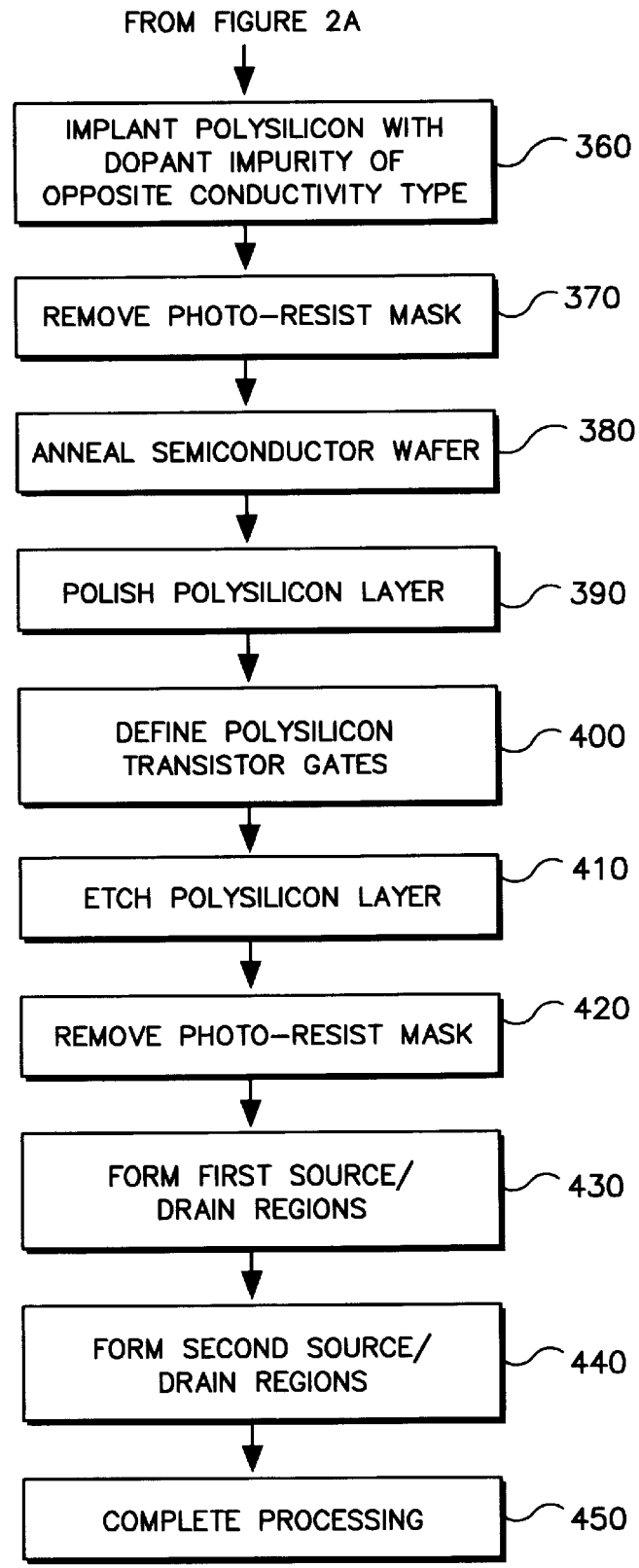

Referring now to FIG. 2, there is shown a flow chart summarizing the method of the present invention for producing thin polysilicon transistor gates. According to one embodiment of the present invention, a predoped semiconductor substrate 102 of a desired semiconductor material such as silicon, for example, is selected 270 for processing. Next, a shallow trench 104 is provided to isolate the active regions. Afterwards, a p-well region 106 and an n-well region 108 are fabricated 280 in semiconductor substrate 102 using conventional photolithographic processing techniques and equipment. Next, a gate insulating layer 110 is established 300 on the substrate 102 by oxide growth processing. After establishing the gate insulating layer 110, the polysilicon layer 112 is deposited 310 on the substrate 102 and masked 320 with a photo-resist layer 114 to define the locations of the channel regions of one conductivity type. The exposed polysilicon layer 112a is implanted 330 with dopant impurities of one conductivity type using standard ion implantation techniques and afterwards, the photo resist mask 114 is removed 340. The polysilicon layer 112 is then masked 350 with a photo resist layer 118 to define the locations of the channel regions of the opposite conductivity type. The exposed polysilicon layer 112 is implanted 360 with dopant impurities of the opposite conductivity type using standard ion implantation techniques and the photo-resist mask 118 is removed 370. The semiconductor wafer 100 is then annealed 380 using conventional methods to activate the dopants in the polysilicon layer 112. The polysilicon layer 112 is then polished 390, preferably with a chemical-mechanical polish (CMP), and then masked 400 with a photo resist layer 124 and etched 410 to define the polysilicon transistor gates. After removal of the photo-resist mask 124, a first set of source and drain diffusion regions are formed 430 in the semiconductor wafer 102. A second set of source and drain diffusion regions 130 are then formed 440 in the semiconductor wafer 100. Finally, standard MOS processes are used to complete 450 processing of the semiconductor wafer 100. Therefore, a method of the present invention produces thin polysilicon transistor gates using a dual doped polysilicon.

What is claimed is:

1. A high temperature method of forming polysilicon gates over a channel region in the processing of a semiconductor device on a semiconductor substrate, the high temperature method being suitable for subsequent anneal processing at temperatures equal to or greater than 750° C., the method comprising the steps of:

depositing a layer of polysilicon having a first thickness over a region of the substrate;

ion implanting a first region of said first thickness of said polysilicon layer with a first conductivity type dopant;

polishing said first thickness of said polysilicon layer to a second thickness thinner than the first thickness; and after the step of polishing said polysilicon layer, masking and etching said polysilicon layer to form the transistor gates.

2. The method of claim 1, wherein:

said polishing includes a chemical-mechanical polishing.

3. The method of claim 1, further comprising:

after the step of ion implanting a first region of said first thickness of said polysilicon layer with a first conductivity type dopant, ion implanting a second region of said first thickness of said polysilicon layer with a second conductivity type dopant, said first and second regions being non-overlapping regions in the polysilicon layer.

4. The method of claim 1, further comprising after the step of ion implanting a first region of said first thickness layer of said polysilicon layer with a first conductivity type dopant, annealing said polysilicon layer to activate dopants and to form low resistivity polysilicon.

5. The method of claim 3, further comprising after the step of ion implanting a second region of said first thickness of said polysilicon layer with a second conductivity type dopant, annealing said polysilicon layer to activate dopants and to form low resistivity polysilicon.

6. A high temperature method of forming polysilicon gates over a channel region in the processing of a semiconductor device on a semiconductor substrate, the high temperature method being suitable for subsequent anneal processing at temperatures equal to or greater than 750° C., the method comprising the steps of:

depositing a layer of polysilicon having a first thickness over a region of the substrate;

ion implanting a first region of said first thickness of said polysilicon layer with a first conductivity type dopant;

ion implanting a second region of said first thickness of said polysilicon layer with a second conductivity type dopant, said first and second regions being non-overlapping regions in the polysilicon layer;

polishing said first thickness of said polysilicon layer to a second thickness thinner than the first thickness; and after the step of polishing said polysilicon layer, masking and etching said polysilicon layer to form the transistor gates.

7. The method of claim 6, wherein:

said polishing includes a chemical-mechanical polishing.

8. The method of claim 6, further comprising annealing said polysilicon layer to activate dopants and to form low resistivity polysilicon.

* * * * *